US006784912B2

(12) United States Patent
Beier et al.

(10) Patent No.: US 6,784,912 B2
(45) Date of Patent: Aug. 31, 2004

(54) COMPACT MULTIBEAM LASER LIGHT SOURCE AND INTERLEAVING RASTER SCAN LINE METHOD FOR EXPOSING PRINTING PLATES

(75) Inventors: Bernard Beier, Ladenburg (DE); Uwe Ernst, Mannheim (DE); Bernd Vosseler, Heidelberg (DE)

(73) Assignee: Heidelberger Druckmaschinen AG, Heidlelberg (DE)

( * ) Notice: Subject to any disclaimer, the term of this patent is extended or adjusted under 35 U.S.C. 154(b) by 77 days.

(21) Appl. No.: 09/879,609

(22) Filed: Jun. 12, 2001

(65) Prior Publication Data

US 2002/0005890 A1 Jan. 17, 2002

(30) Foreign Application Priority Data

Jun. 30, 2000 (DE) ......................................... 100 31 915

(51) Int. Cl.$^7$ ................................................. B41J 2/45
(52) U.S. Cl. ....................................................... 347/238
(58) Field of Search ............................... 347/225, 233, 347/234, 238, 248, 236, 246; 250/204, 205

(56) References Cited

U.S. PATENT DOCUMENTS

| 5,252,513 A |   | 10/1993 | Paoli et al. ................. 437/129 |
|---|---|---|---|
| 5,300,956 A | * | 4/1994 | Ohta et al. ................... 347/233 |
| 5,305,022 A |   | 4/1994 | Ota et al. .................... 346/108 |
| 5,521,748 A |   | 5/1996 | Sarraf ......................... 359/321 |
| 5,691,759 A |   | 11/1997 | Hanson ........................ 347/233 |
| 5,930,280 A |   | 7/1999 | Rossi et al. ................... 372/50 |
| 5,959,655 A | * | 9/1999 | Maruo et al. ............... 347/246 |
| 6,037,962 A | * | 3/2000 | Hanson et al. .............. 347/233 |

FOREIGN PATENT DOCUMENTS

| DE | 4313111 C2 | 10/1994 |
|---|---|---|
| EP | 0878773 | 11/1998 |
| EP | 0947950 | 10/1999 |

* cited by examiner

Primary Examiner—Michael Nghiem
(74) Attorney, Agent, or Firm—Davidson, Davidson & Kappel, LLC

(57) ABSTRACT

An individually drivable array of single stripe laser diodes is proposed for imaging printing plates. An imaging optics is used to produce n image points which have a spatial interval l between adjacent points. An interleaving raster scan line method is indicated, which, given proper selection of the increment, enables each dot to be exposed exactly once.

25 Claims, 3 Drawing Sheets

COMPACT MULTIBEAM LASER LIGHT SOURCE AND INTERLEAVING RASTER SCAN LINE METHOD FOR EXPOSING PRINTING PLATES

BACKGROUND INFORMATION

The present invention is directed to a device for imaging printing plates using an array of n laser diodes.

For some time now, devices and methods have been known, which make it possible to image a printing plate, whether it be a flat or curved surface, through exposure to laser radiation. Devices and methods of this kind are used, in particular, in so-called CtP systems, computer-to-plate, or direct imaging print units or printing presses for manufacturing offset printing forms.

At the present time, printing plates are primarily imaged by laser diode systems. Their inherent system properties prevent them from reaching the physical limits of the beam quality. In particular, their low beam quality limits their depth of focus, so that an autofocusing system is needed at high resolutions. Two different approaches are currently used for multibeam imaging, i.e., for simultaneously exposing a plurality of image points on various media, such as printing plates, films, data carriers or the like. On the one hand, the radiation from individual laser diodes or an array of laser diodes can be directly applied via optical elements, such as lenses, mirrors or fibers, to the medium to be imaged. On the other hand, the radiation from a laser light source, typically laser diode bars, can be projected via diverse optical elements onto an array of n modulators. For the most part, these are electrooptical or acoustooptic modulators. By selectively driving the n modulators, one can select individual beams from the entire radiation and modulate their power. The selected, power-modulated beams are supplied via further optical elements to the medium to be imaged.

European Patent Application No. 0 878 773 A2 describes an optical system for imaging an array of light sources, in particular an individually addressable array of laser substantially greater than their emitter height. The emission region is typically about 1 micrometer high and 60 micrometers wide. The optical system is composed of a system of non-anamorphotic imaging lenses and of a cylinder lens, which is placed between the array and the imaging lens system and images the laser radiation onto the scanning surface. This surface usually does not lie in the foci of the laser beams, so that a widening of the short dimensions of the imaged emission surface occurs.

U.S. Pat. No. 5,521,748 describes a system for exposing image data using an individual laser or an array of diodes and a light modulator. The light transmitted by the laser or the array is imaged onto a modulator having a row of light-modulating elements of the reflectance or transmittance type. Once selection and power modulation are carried out, the radiation is imaged onto a surface having light-sensitive material, forming individual image points. To place image points of this kind on a complete, two-dimensional surface, a relative motion of the image points to the light-sensitive material is provided. In the interplay resulting from generation of the individual points and the relative motion, the desired image data are then exposed on the two-dimensional surface. The relative motion between the light beams emanating from the light modulator and the light-sensitive material can be effected on a cylindrical configuration such that lines are exposed in a meander shape along the axis of symmetry of the cylinder, or such that lines run around the cylinder in a helical form.

U.S. Pat. No. 5,691,759 discusses a multi-beam laser light source, which produces raster scan lines on a medium using the so-called interleaving raster scan line method. The interleaving raster scan line method is distinguished by the following properties. A laser light source emits radiation, from which n image points are produced using modulated power by employing suitable imaging optics and modulation. These n image points are arranged in a row, and the distance between two adjacent points is (n+1)p, p being the distance between the dots. Provision is made between the medium and the image points for a relative motion in both directions, spanning the surface of the medium. Once n points are imaged, the medium is displaced relatively to the image points with a translational component that is perpendicular to the direction defined by the axis of the image points, so that n points can again be exposed at another location of the medium. In this manner, so-called scan lines of image points are formed, initially at a distance of (n+1)p, which are produced by laser radiation, whose power is modulated in dependence upon the image information. Upon completion of a scan having a translational component in the perpendicular direction, a displacement by the distance (n×p) follows in parallel to the direction defined by the axis of the n image points. The n image points are then shifted again with a translational component that is perpendicular to the direction defined by the axis of the image pixels on the surface, forming further scan lines. Thus, each raster scan line is separated from its immediate neighbor by the pitch distance p between the dots. Using a plurality of optical beams from a laser light source, an overlapping of the scan lines ensues (interleaving raster scan line method).

An enhanced interleaving raster scan line method for a multibeam laser light source is described in European Patent Application No. 0 947 950 A2. In the case of n image points having a pitch distance p of the dots, each of whose adjacent image points are separated by the distance (q×n+1)p, q being a natural number, an incremental distance of n×p results by which the medium must be moved between the marking of two scan lines. An overlapping (interleaving) of the scan lines is thereby achieved, in other words, the new scan lines are written between the old scan lines. By properly selecting the displacement in parallel to the axis defined by the image points, by the distance n×p, an imaging is then possible, without one location, where image information is to be scanned, being repeatedly exposed to one image point of a laser. What distinguishes the described method is that adjacent image points of the laser diodes are spaced further apart, in each case, than the width of the displacement by which the medium is moved between the old and new scan lines.

Various disadvantages are associated with each of the known devices. The radiation emitted by broad array laser diodes, laser diode bars, and laser diode stacks exhibits a low beam quality, as quantified by the diffraction index $M^2$. Even with correction, the attainable depth of focus is only suited for imaging at a low resolution, typically 1,270 dpi. Therefore, to produce very small dots, for example resolutions of about 2,540 dpi, an autofocusing system is necessary, which requires a complex mechanical and electrical design. If the light source and modulator are provided separately, there is an increased requirement for optical, electronic and mechanical components, as well as for substantial overall space. Many components need to be adjusted, and the service life can be clearly limited. The temperature management of the components turns out to be just as problematic. Only a limited, minimal physical size is possible when a device for imaging printing plates is assembled from discrete components. The described interleaving raster scan line method is not suited for compact laser light sources, since the distance between adjacent image points must always be one unit p greater than the number of beams, so that one must revert to scanning methods in which image points are set densely together.

SUMMARY OF THE INVENTION

An object of the present invention is to provide a device for imaging printing plates using an array of n laser diodes, whose emitted light exhibits a good beam quality and which renders possible a compact design. An additional or alternate object of the present invention is to provide an improved interleaving raster scan line method.

The present invention provides a device for imaging printing plates using an array (10) of n laser diodes which are imaged onto n image points (110), so that one laser diode (12) is allocated to each i-th point having i from $\{1, \ldots, n\}$, the n image points (110) being separated by a spatial interval of adjacent points l, and a pitch distance p of the dots being provided. The laser diodes (12) are individually drivable single stripe laser diodes.

The present invention also provides a method, i.e., a so-called interleaving raster scan line method, for imaging printing plates by generating raster points using an array of n laser light sources, which are imaged using an imaging optics onto n image points, which are arranged on a line, the n image points being separated by a spatial interval of adjacent points l, comprising the following method steps:

simultaneous generation of n image points on the printing plate by a number of laser light sources;

generation of a relative motion between the image points and printing plate;

displacement of the image points with a translation component perpendicular to the axis defined by the line of the image points by a first specific amount;

displacement of the n image points in the direction defined by the n image points by a second specific amount; and iteration of the displacements in question, wherein the amount of the second specific displacement is greater than the spatial interval l of adjacent image points.

In accordance with the present invention, the device for imaging printing plates includes an array of n single stripe laser diodes. Each single stripe laser diode can be driven individually. The n laser beams can preferably be imaged onto the medium using light-transmitting means, such as lenses, mirrors, optical fibers or the like. The n image points produced with the assistance of imaging optics are advantageously disposed on a line and have a spatial interval l between adjacent points. It is generally only necessary, however, that the n image points projected onto a predefined line in the surface of the printing plate have a constant spatial interval l. A relative motion takes place between the medium and the image points in both directions, spanned by the surface of the medium. In addition to the motion, which, in order to displace the image points with a translational component perpendicular to the direction defined by the line of the n image points or by the predefined line, on which the projected n image points exhibit a constant spatial interval l, a displacement takes place in parallel to the direction defined by line of the n image points or by the predefined line, on which the projected n image points exhibit a constant spatial interval l. The amount of this displacement is advantageously greater than or equal to the spatial interval l between the n image points. Raster scan lines are produced which exhibit a pitch distance p between the dots, pitch distance p between the dots being smaller than spatial interval l between the image points.

One preferred specific embodiment provides that the power supply to the array of the laser diodes be regulated. A suitable detector element advantageously checks for proper functioning, and, as the case may be, for potential malfunctioning of a single stripe laser diode, either on the outcoupling side of the laser diode or, however, at another cavity mirror. In this context, the detector element can be both a detector row, as well as an individual detector, which scans the individual single stripe laser diodes.

One derives a number of advantages from the use of an array of n single stripe laser diodes, which can be individually driven, and from the application of the corresponding interleaving raster scan line method to image printing plates. An excellent beam quality is achieved by using single stripe laser diodes. Typically, the value of diffraction index $M^2$ is slightly higher than one. In a compact design, a high level of integration can be achieved: radiation source, modulation, and control can be combined in one component. The result is fewer optical components and, therefore, less need for adjustment of sensitive components. The service life of the component is essentially limited only by the service life of the laser. The compact, modular design makes the system scalable. A high-performance stability is assured by a rapid control. The high level of integration provides for a simpler temperature management, since it is only necessary to cool this one component. Due to the low diffraction index $M^2$, a maximum possible depth of focus is achieved when focusing.

BRIEF DESCRIPTION OF THE DRAWINGS

Further advantages and beneficial specific embodiments of the present invention are presented on the basis of the following figures, as well as their descriptions, in which.

DETAILED DESCRIPTION

Figure 1:
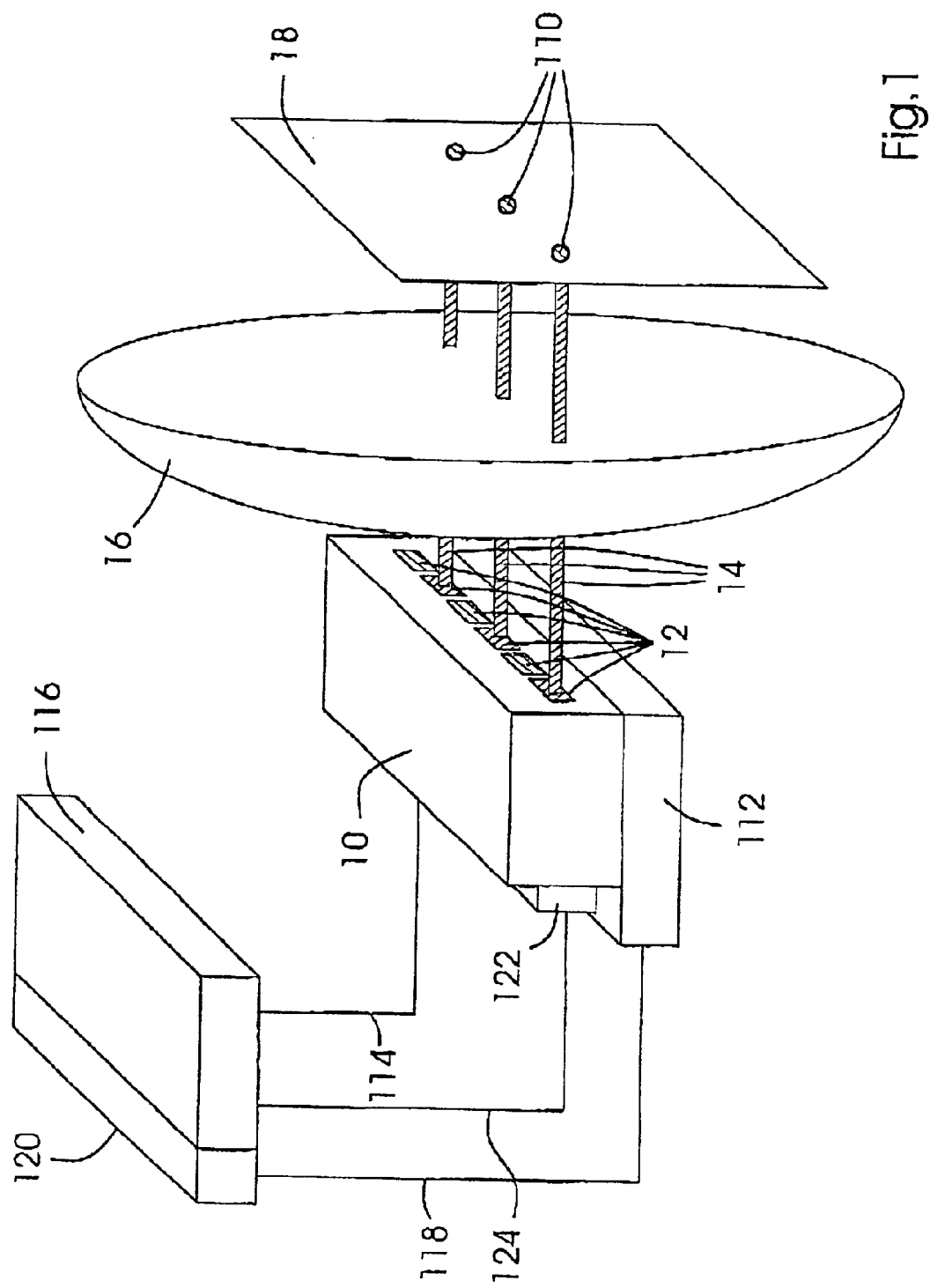
FIG. 1 shows a schematic view of the typical geometry in the imaging of a printing plate by an array of laser diodes having n laser beams.

FIG. 1 depicts a typical geometry for projecting n laser light beams which emanate from an array of n laser diodes. Light source 10 is composed of an individually drivable array of n single stripe laser diodes 12. It is customary for a light source of this kind to have up to 100 single stripe laser diodes, advantageously between 10 and 60. The single stripe laser diodes have emitter surfaces of a typical size of 1×5 micrometers$^2$, and emitted laser radiation of an advantageous beam quality with a low diffraction index $M^2$. The individual laser diodes are usually spaced apart on the array by distances of between 100 and 1000 micrometers. Imaging optics 16 is used to project the n laser beams onto n image points 110 on a plate 18. Printing plate 18 is advantageously situated in the foci of laser beams 14. It is of particular benefit that imaging optics 16 not only modifies the diameter proportions of the laser beams (perpendicularly and in parallel to the axis defined by the n points), but that it also corrects the distance by which the image points are set apart from one another. In other words, both the spot size of n image points 110, as well as their position relative to one another and their spatial interval are adjustable. As a general rule, the individual laser diodes are spaced apart by a constant distance; however, the minimum requirement for an advantageous imaging is only that spatial interval l of n image points 110 be constant. The spatial interval l among the n image points is greater than the pitch distance p among the dots.

Light source 10 can be used in continuous operation. To produce individual light packets, the laser emission is suppressed accordingly by a specific time interval. One specific embodiment also provides, however, for employing a light source 10 which emits pulsed radiation. When working with pulsed radiation, the repetition rate of the light pulses must be at least exactly as great as the pulse frequency used to generate the individual dots, so that at least one laser pulse is available for one dot. Imaging optics 16 can have reflective, transmittive, refractive, or similar optical components. These are preferably micro-optical components. Imaging optics 16 can be both enlarging as well as reducing, and also have different imaging scales in both directions, in parallel and perpendicular to the active zone of the lasers. This is particularly beneficial for correcting divergence and aberration. The physical or chemical properties of the surface of printing plate 18 are modified by the laser radiation. Printing plates which are erasable or rewritable are advantageously used.

In one preferred specific embodiment, light source 10 is disposed on a cooling element 112. Light source 10 is linked via a current-supply and control line 114 to control unit 116. Control unit 116 has individual components, which enable individual laser diodes of the array to be driven or regulated separately from one another. Cooling element 112 is linked via a line 118 for controlling cooling element 112 to temperature control 120.

A detector 122 is provided to test for correct functioning and determine the power output of individual laser diodes 12. The design of the detector can be such that an individual measuring device is provided for each laser diode or, however, that a measuring device checks the individual laser diodes at the time of replacement or as needed. Detector 122 is advantageously linked via connection 124 to control unit 116, so that the power output is processed, inter alia, as a parameter for generating a control signal in laser control 116.

A device of this kind in accordance with the present invention can be provided as an internal device in a print unit or a printing press, or be provided externally thereto.

Figure 2:
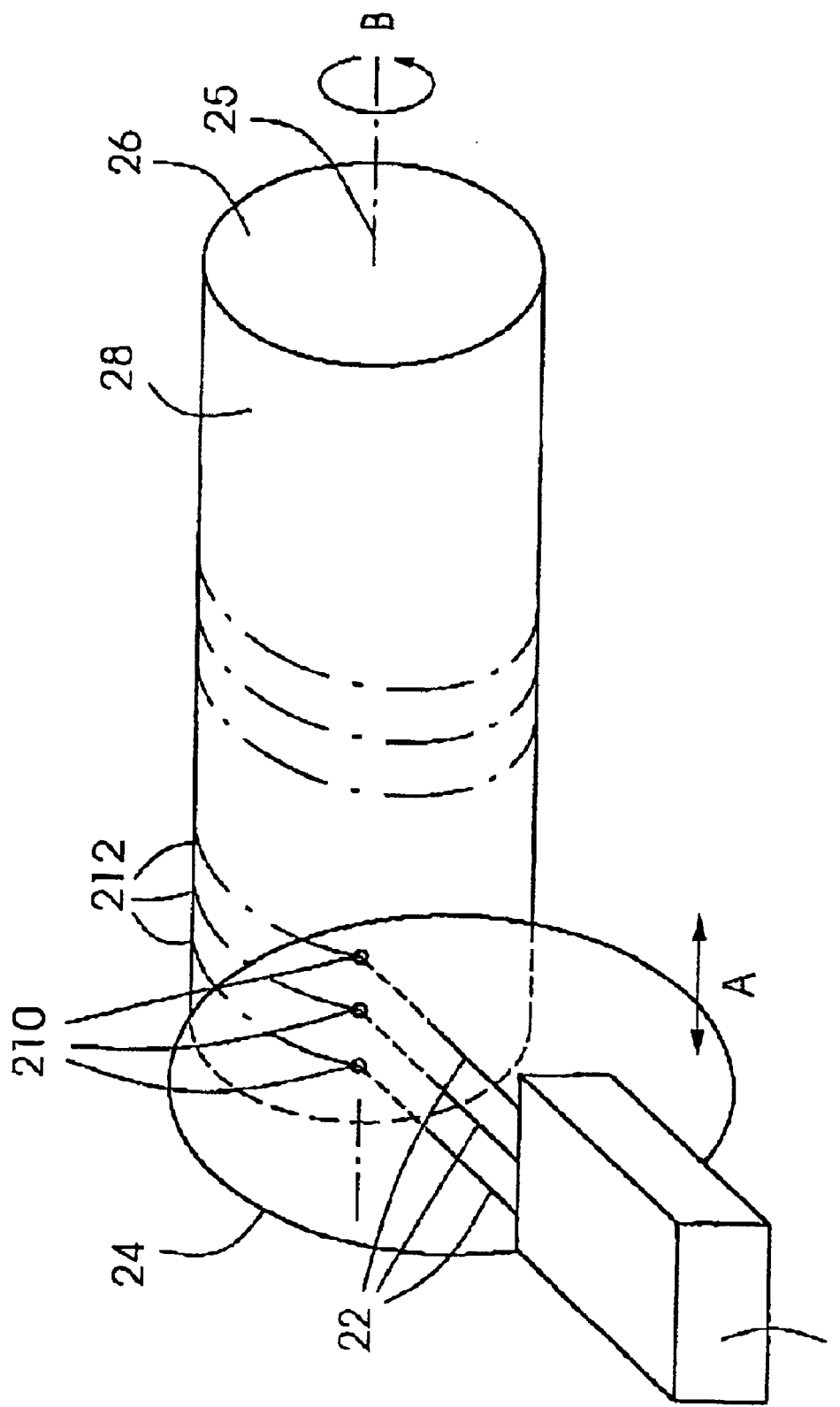
FIG. 2 shows a schematic view of the imaging of a printing plate on a cylinder by an array of n laser beams.

FIG. 2 illustrates the imaging of a printing plate, which is situated on a rotatable cylinder. Light source 20 produces n laser beams 22, which are projected using imaging optics 24 onto n image points 210. The n image points are uniformly spaced apart and are disposed on one axis. Printing plate 28 is situated on a cylinder 26, which is rotatable about its axis of symmetry 25. This rotation is denoted by arrow B. Light source 20 can be moved in parallel to axis of symmetry 25 of the cylinder on a linear path shown by double arrow A. For continuous imaging, cylinder 26 rotates with printing plate 28 in accordance with rotational motion B, and the translation of the light source along the cylinder is in accordance with moving direction A. The feed rate is determined by the number of laser beams 22 and the width p of a dot. The result is an imaging which encircles axis of symmetry 25 of cylinder 26 on a helical path. The path of image points 210 is indicated by lines 212. In other words, once imaging of n points is complete, a relative displacement of printing plate 28 and image points 210 follows with a vector component perpendicular to the direction defined by the line of the n image points, by a first specific amount, so that n points are exposed again at another position of printing plate 28. In this manner, so-called raster scan lines of image points are formed. For each specific spacing of adjacent raster scan lines and number n of image points, a second specific amount of a necessary displacement is derived, in parallel to the axis defined by the line of n image points, so that a continuous imaging, i.e., the imaging of each raster point provided on printing plate 28, is possible using the interleaving raster scan line method.

In one alternative exemplary embodiment, image points 210 can also be moved in a meander shape over printing plate 28, in that a complete imaging is initially carried out along one line in parallel to axis of symmetry 25 of cylinder 26, and a step-by-step rotation is subsequently carried out about axis of symmetry 25 of cylinder 26.

It is clear that it is only a question of a relative movement between image points 210 and printing plate 28. This relative movement can also be achieved by a movement of impression cylinder 26. For both moving directions of translation A and rotation B, it holds that the movements can take place continuously or step-by-step.

In another alternative specific embodiment, the device for imaging printing plates having light source 20, imaging optics 24 and the like, can also be provided inside of impression cylinder 26, thereby achieving a space-saving configuration.

Prior to describing the interleaving raster scan line method in detail on the basis of a figure, general explanations in this regard are provided. As already mentioned, to image a printing plate, the image points are shifted over the printing surface, initially with a component perpendicular to the direction defined by the line of the image points, in order to form so-called raster scan lines. A contiguous line of dots is understood to be a line formed by the subsequent displacement in the direction defined by the direction of the dots. In other words, the dots are situated at the same level and belong to different scan lines that are scanned next to one another.

The distances between the n image points simultaneously produced by the individual n laser diodes are selected to be constant; the length between two adjacent image points l is advantageously an integral multiple m of pitch distance p between the dots, in other words l=m×p. A continuous inscription, i.e., each raster point is exposed at least once to the image point of a laser, with n simultaneously scanned image points at the distance l=m×p, m being a natural number and p the distance between the dots, is always possible if one selects an appropriate displacement. The width of the displacement is advantageously equal to the number of image points.

It can also happen, in this context, that one point is inscribed several times. A continuous inscription, in other words each dot is exposed exactly once, is especially possible when the number of image points n and their spatial interval l, measured in units of the pitch distance p of the dots, do not have a common divisor. Expressed differently, n and m are prime. This is the case, for example, when m and n are different prime numbers. At the same time, the displacement, which is stipulated by the direction given by the line defined by the n image points, is to be selected as n. In the process, an edge area of the size r: r=n×m−(n+m−1) results at the beginning and end of the line to be scanned.

Since each of the laser diodes can be driven discretely, each dot can be configured individually. The performance of one specific laser beam provided for inscribing a raster point is stipulated in accordance with the image data information given. This enables the optical density of different dots to be achieved on an individual basis.

Figure 3:
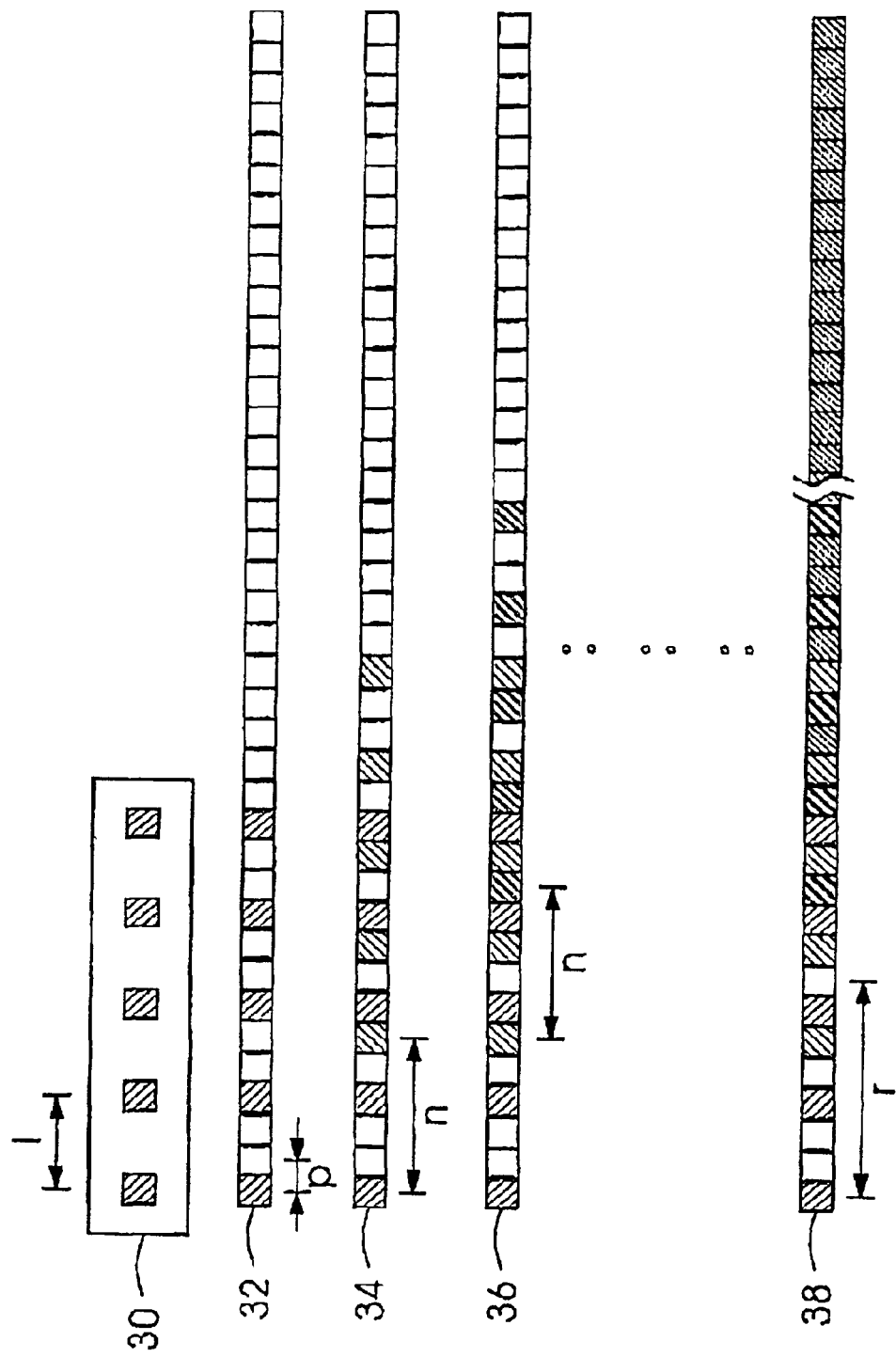
FIG. 3 shows an example of imaging including an array of five image points in the interleaving raster scan line method.

FIG. 3 illustrates the interleaving raster scan line method for inscribing printing plates, based on an example of five image points, which are produced at the same time by the simultaneous irradiation using five individual laser diodes. In this figure, dots are depicted in simplified form as small boxes. As already mentioned, each dot must be exposed once to an image point of a laser, so that it is exposed in accordance with the image data given, or it can be left unchanged. In this example, a contiguous line to be scanned is composed of dots disposed side-by-side and without gaps in a row. Their pitch distance is designated by p. In FIG. 3, the group of simultaneously exposed dots 30 is composed of five image points exhibiting a uniform spatial interval l. In first imaging 32, five unit points are exposed with spatial interval l=3p. The group of simultaneously produced dots 30 is then displaced by five unit points, since, in this example, five dots are simultaneously written in the direction defined by the axis of the dots; in this example, to the right. In second imaging step 34, five image points are again set. A renewed displacement by five unit points follows iteratively in the direction defined by the axis of the dots; in this example, to the right. In imaging step 36 that follows, five points are set once again. From this sequence, it is apparent that the printing plate can be inscribed without gaps: each dot represented by a small box is exposed once to the image point of a laser. In each renewed imaging following a displacement step by five units of length, measured in units of p to the right, the same pattern is always produced at already exposed and still unexposed dots, as is apparent in 38. In other words, at its right end, the line of exposed image points still has certain gaps of unexposed raster points. If, at this point, a further imaging of five raster points takes place at the right end, then the same sequence of still unexposed and already exposed raster points is obtained. At the same time, the portion of the line composed of completely inscribed dots becomes longer and longer. Likewise apparent in 38 is the edge area of size r, in this case eight dots, measured in units of pitch distance p of the dots.

Even in the event that individual single stripe laser diodes in the array fail, the proposed interleaving raster scan line method can be used for scanning. Particularly when the number of n image points of the laser beams and the spatial interval between two adjacent image points l, measured in units of p, are prime, the imaging speed is at a maximum. In other words, it is possible to specify an increment, so that each point to be scanned is exposed only once to an image point of the laser beams.

In the event that one or more of the single stripe laser diodes in the group of simultaneously scanned image points 30 is not functioning properly, it is still possible to inscribe using the interleaving raster scan line method. In such an instance, it is always the largest section of the group having equidistant, adjacent image points that is used for inscription. In order to achieve a continuous inscription, one must then obviously reduce the increment. It is beneficial to do so in accordance with the above established rules with respect to the properties of natural numbers.

The interleaving raster scan line method can be used to image a printing plate for every combination of distances between adjacent image points l and their number n. To continuously inscribe the printing plate, however, one must select appropriate parameters. If one image point should drop out, an imaging at a reduced speed is possible.

The described interleaving raster scan line method requires a multiplicity of laser beams to inscribe a printing plate. These can also be produced by laser light sources other than the advantageously used laser diodes. To modify the projected distance between the individual light sources, one advantageous refinement provides for tilting the printing plate by an angle that differs from zero with respect to the plane disposed perpendicularly to the n laser beams.

Another advantageous refinement of the present invention provides for a two-dimensional array of $n_1 \times n_2$ image points. When extrapolating accordingly, from one to two dimensions, spatial intervals $l_1$ and $l_2$ between adjacent points in the two mutually perpendicular directions must be constant in each case, so that $n_2$ lines can be processed in parallel at distance $l_2$, in accordance with the discussed one-dimensional interleaving raster scan line method employing $n_1$ image points at distance $l_1$. A displacement is then likewise carried out in the perpendicular direction in accordance with the rules established for the interleaving raster scan line method, in order to densely place dots.

Printing plates as defined wherein can include all types of printing forms.

Reference Symbol List 10 light source, individually drivable laser diode array
12 single stripe laser diodes
14 light beam
16 imaging optics
18 printing plate
110 image point
112 cooling element
114 current-supply and control line
116 control unit
118 temperature-control line
120 temperature control
122 detector for testing functioning and measuring power
124 connection to control
20 light source
22 laser beams
24 imaging optics
25 axis of symmetry
26 cylinder
28 printing plate
210 image points
212 path of image points
A translation
B rotation
30 group of simultaneously scanned dots
32 first imaging
34 second imaging
36 third imaging
38 iterative imaging
l spatial interval of the image points
p pitch distance of the dots
n number of image points
r edge area

What is claimed is:

1. A device for imaging printing plates comprising:
   an array of n laser diodes which image n image points, so that one laser diode of the array is allocated to each i-th point, with i being from $\{1, \ldots, n\}$, the n image points being separated by a spatial interval l between adjacent image points, with a pitch distance p of dots to be imaged by the array, the laser diodes being individually-drivable single stripe laser diodes, wherein the spatial interval l between adjacent image points, measured in units of the pitch distance p of the dots, is an integral multiple m of the pitch distance p between the dots; and wherein the integral multiple m and the number n of image points have no common divisor; and at least one detector for testing for correct functioning and determining a power output of one or of a plurality of the laser diodes.

2. The device as recited in claim 1 wherein the spatial interval l of adjacent image points, measured in units of the pitch distance p of the dots, is smaller than the number n of the image points.

3. The device as recited in claim 1 wherein the multiple m and the number n of the image points are prime numbers.

4. The device as recited in claim 1 further comprising imaging optics for correcting at least one of divergence and aberration.

5. The device as recited in claim 1 further comprising a control unit, at least one of the laser diodes of the array being controlled by the control unit.

6. The device as recited in claim 1 wherein the number of laser diodes in the array is between 10 and 100.

7. The device as recited in claim 1 further comprising a detector for determining a power output of at least one of the plurality of laser diodes and a laser controller, the laser controller being controlled as a function of the power output determined by the detector.

8. The device as recited in claim 1 wherein at least one laser diode is a pulse controlled laser.

9. The device as recited in claim 1 wherein a repetition rate of the light pulses is at least exactly as great as a pulse frequency of the pulse-controlled laser in order to displace the individual dots.

10. The device as recited in claim 1 further comprising imaging optics including at least one reflective optical element.

11. The device as recited in claim 1 further including imaging optics having micro-optical components.

12. The device as recited in claim 1 wherein the device is in a computer-to-plate unit and the printing plate is an offset printing plate.

13. The device as recited in claim 1 wherein the device further comprises a cylinder, the printing plate being situated on the cylinder.

14. The device as recited in claim 1 wherein the array of laser diodes is movable with respect to the printing plate.

15. A device for imaging printing plates comprising:

an array of n laser diodes which image n image points, so that one laser diode of the array is allocated to each i-th point, with i being from $\{1, \ldots, n\}$, the n image points being separated by a spatial interval l between adjacent image points, with a pitch distance p of dots to be imaged by the array, the laser diodes being individually-drivable single stripe laser diodes, wherein the laser diodes are spaced apart on the array by a distance of between 100 and 1000 micrometers, and a width of emitter surfaces of the laser diodes is less than 10 micrometers.

16. The device as recited in claim 15 wherein the width is 5 micrometers.

17. An interleaving raster scan line method for imaging printing plates by generating raster points using an array of n laser light sources, which use an imaging optics to image n image points arranged on a line, the n image points being separated by a spatial interval of adjacent points l, comprising the steps of:

simultaneously generating n image points on a printing plate by a plurality of laser light sources;

generating a relative motion between the image points and printing plate;

displacing the image points with a translation component perpendicular to the line of the image points by a first specific amount;

displacing the n image points in a direction defined by the line of the n image points by a second specific amount;

repeating the displacement steps, an amount of the second specific displacement being greater than the spatial interval l of adjacent image points.

18. The interleaving raster scan line method as recited in claim 17 wherein the second specific amount, measured in units of the pitch distance p of dots to be imaged, is equal to the number n of image points.

19. The interleaving raster scan line method as recited in claim 18 wherein the spatial interval l of the image points is an integral multiple of the pitch distance p of dots of the laser diodes.

20. The interleaving raster scan line method as recited in claim 17 wherein the spatial interval l of the image points, measured in units of a pitch distance p of dots of the laser diodes, and the number of laser diodes n have no common divisor.

21. The interleaving raster scan line method as recited in claim 20 wherein the spatial interval l of the image points, measured in units of the pitch distance p of the dots, and the number of laser diodes are prime numbers.

22. A print unit comprising at least one device for imaging printing plates, the device including an array of n laser diodes which image n image points, so that one laser diode of the array is allocated to each i-th point, with i being from $\{1, \ldots, n\}$, the n image points being separated by a spatial interval l between adjacent image points, with a pitch distance p of dots to be imaged by the array, the laser diodes being individually-drivable single stripe laser diodes; the spatial interval l between adjacent image points, measured in units of the pitch distance p of the dots, being an integral multiple m of the pitch distance p between the dots; wherein the integral multiple m and the number n of image points have no common divisor; and at least one detector for testing for correct functioning and determining a power output of one or of a plurality of the laser diodes.

23. A printing press comprising at least one print unit in accordance with claim 22.

24. A print unit comprising at least one device for imaging printing plates, the device including an array of n laser diodes which image n image points, so that one laser diode of the array is allocated to each i-th point, with i being from $\{1, \ldots, n\}$, the n image points being separated by a spatial interval l between adjacent image points, with a pitch distance p of dots to be imaged by the array, the laser diodes being individually-drivable single stripe laser diodes, the laser diodes being spaced apart on the array by a distance of between 100 and 1000 micrometers, and a width of emitter surfaces of the laser diodes being less than 10 micrometers.

25. A printing press comprising at least one print unit in accordance with claim 24.

* * * * *